(12) United States Patent
Jung et al.

(10) Patent No.: US 6,225,020 B1
(45) Date of Patent: May 1, 2001

(54) POLYMER AND A FORMING METHOD OF A MICRO PATTERN USING THE SAME

(75) Inventors: Jae Chang Jung; Myoung Soo Kim; Hyung Gi Kim; Chi Hyeong Roh; Geun Su Lee; Min Ho Jung; Cheol Kyu Bok; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/301,944

(22) Filed: Apr. 29, 1999

(30) Foreign Application Priority Data

Apr. 30, 1998 (KR) .................................. 98-16222

(51) Int. Cl.$^7$ ............................. G03F 7/004; G03F 7/38; C08F 22/40; C08F 32/04
(52) U.S. Cl. ...................... 430/270.1; 430/315; 430/329; 526/262; 526/264; 526/281
(58) Field of Search ................... 430/270.1, 329, 430/323, 315; 526/262, 281, 264

(56) References Cited

U.S. PATENT DOCUMENTS

| | | | |
|---|---|---|---|
| 4,857,435 | * 8/1989 | Hopf et al. | 430/192 |
| 5,312,717 | * 5/1994 | Sachdev et al. | 430/313 |
| 5,843,624 | * 12/1998 | Houlihan et al. | 430/296 |
| 6,001,739 | * 12/1999 | Konishi | 438/692 |
| 6,028,153 | 2/2000 | Jung | 526/258 |

FOREIGN PATENT DOCUMENTS 2 320 717    7/1998    (GB) .

5-297591    * 11/1993    (JP) .

OTHER PUBLICATIONS

Aldrich Chemical Catalog, 1990–91, pp. 618, 984, 985.*

* cited by examiner

Primary Examiner—Rosemary E. Ashton
(74) Attorney, Agent, or Firm—Townsend and Townsend and Crew LLP

(57) ABSTRACT

The present invention relates to a polymer represented by following Formula 1 and a method of forming a micro pattern using the same:

(1)

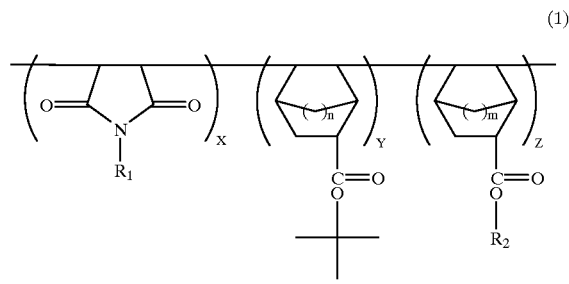

wherein $R_1$ is a $C_1$–$C_{10}$ straight- or branched-chain substituted alkyl group, or a benzyl group; $R_2$ is $C_1$–$C_{10}$ primary, secondary or tertiary alcohol group; m and n independently represent a number from 1 to 3; and X, Y and Z are the respective polymerization ratios of the co-monomers.

The photoresist polymer according to the present invention is suitable for forming an ultra-micro pattern such as used in 4 G or 16 G DRAM semiconductor devices using a light source such as ArF, an e-beam, EUV, or an ion-beam.

20 Claims, 13 Drawing Sheets

0.24 μm 0.23 μm 0.22 μm 0.21 μm 0.20 μm 0.19 μm 0.18 μm 0.17 μm

48mJ/cm², 0.4

46mJ/cm², 0.4

44mJ/cm², 0.4

42mJ/cm², 0.4

40mJ/cm², 0.4

38mJ/cm², 0.4

36mJ/cm², 0.4

34mJ/cm², 0.4

POLYMER AND A FORMING METHOD OF A MICRO PATTERN USING THE SAME

BACKGROUND OF THE INVENTION

The present invention relates to a polymer useful as a photoresist in a lithographic process for fabricating a semiconductor device, and a method of forming a micro pattern using the same. More specifically, the present invention relates to a polymer which can be used in a photoresist composition for forming an ultra-micro pattern in the manufacture of 4G and 16G DRAM semiconductor chips using short wavelength light sources, such as KrF (248 nm), ArF (193 nm), an e-beam, or an ion-beam. The polymer of the present invention is particularly useful in a photoresist composition for the top surface image (TSI) process using silylation, or can be used for a single-layer photoresist.

In the manufacturing process of a semiconductor element, a photoresist is generally used to form a pattern with a fixed form on a semiconductor element. To obtain the desired photoresist pattern, a photoresist solution is coated on a surface of a semiconductor wafer, the coated photoresist is exposed to patterned light, and then the wafer undergoes a developing process. As a result, a photoresist pattern is formed on the wafer.

If the photoresist pattern is manufactured using a conventional silylation process, the photoresist is usually composed of diazonaphthoquinones compounds and a novolac resin, or a photo acid generator and polyvinyl phenol resin. When the photoresist resin is exposed to the patterned light source (e.g. ArF, KrF, or I line) and then baked, an alcohol group (R—O—H) is formed in the resin at the exposed regions. After baking, the photoresist resin is silylated with a silylation agent such as hexamethyl disilazane or tetramethyl disilazane. In the silylation process, an N—Si bond is first formed, but since the N—Si bond is weak, it then reacts with the R—O—H group in the photoresisit polymer to form a R—O—Si bond. The photoresist resin with bonded silicon atoms then undergoes a dry developing using $O_2$ plasma to form a silicon oxide film. The lower portions of the silicon oxide film remain even after the development of the photoresist and as a result, the desired pattern is formed.

The above-described silylation process for forming a photoresist pattern has several deficiencies when it is used with shorter wavelength radiation. In particular, when a KrF eximer laser is used as the light source to expose known photoresist polymers, it is impossible to form an ultra-micro pattern less than 0.10 μm L/S using the silylation process. When an ArF light source is used, the lens of the exposer can be damaged due to the high energy level of the ArF light. Therefore, the photoresist must be exposed to a lower amount of energy, for example, less than 10 mJ/cm2. If the photoresist is not exposed sufficiently to this lower energy, the desired pattern is not formed.

SUMMARY OF THE INVENTION

It has been found that the unique photoresist polymers of the present invention solve the above-described problems of the prior art. The heat-resistant character of the polymers of this invention allow the high temperatures required by the post-exposure baking and silylation steps of the TSI process to be obtained. The polymers of the present invention are particularity suited for use in chemically amplied photoresists wherein a photoresist pattern can be resolved even using a small amount of energy (e.g., 10 mJ/cm$^2$), thereby preventing the damage to the lens of the exposer and the photoresist pattern collapse or insufficient resolution which occurs in the prior art during the formation of the micro pattern using an ArF (193 mn) light source. In addition, the polymers of the present invention are advantageously used in the silylation process wherein a chemically amplified photoresist and $O_2$ plasma are used to form a silicon oxide film which increases the etching and heat resistance of the photoresist such that an acceptable micro pattern can be formed using the dry developing process.

In one embodiment, the present invention relates to a polymer which is suitable for use as a single layer photoresist, and preferably as a photoresist in the TSI process. Preferred photoresist polymers of the present invention are represented by the following Formula 1:

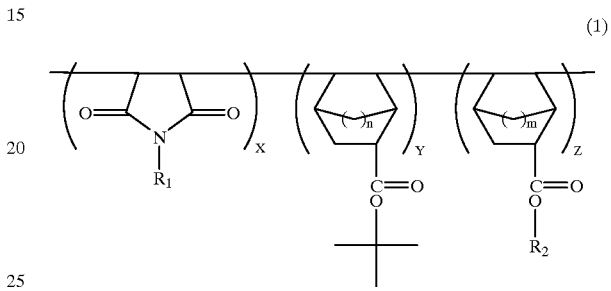

wherein, $R_1$ is a $C_1$–$C_{10}$ straight- or branched-chain alkyl group, or a benzyl group; $R_2$ is a $C_1$–$C_{10}$ primary, secondary or tertiary alcohol group; m and n independently represent a number from 1 to 3; and X, Y, and Z are the respective polymerization ratios of the co-monomers; the ratio X:Y:Z preferably being (10–80 mol %):(10–80 mol %):(10–80 mol %).

Another embodiment of the present invention relates to a preparation method for the polymer represented by the above Formula 1.

In still another embodiment, the present invention relates to a photoresist composition containing the polymer represented by the above Formula 1, a solvent, and a photoacid generator.

In a further embodiment, the present invention relates to a method of forming a micro pattern using the above-described photoresist composition.

DETAILED DESCRIPTION OF THE INVENTION

Figure 1A:
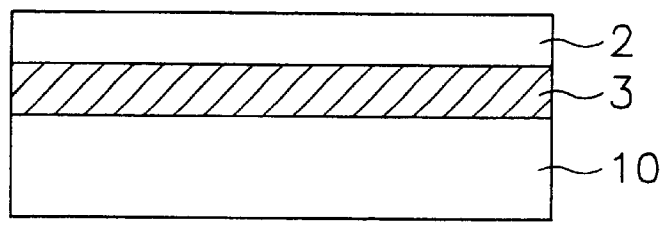
FIGS. 1a to 1f are schematic cross-sectional views showing a process for forming a photoresist pattern using a polymer of the present invention.
Figure 1B:
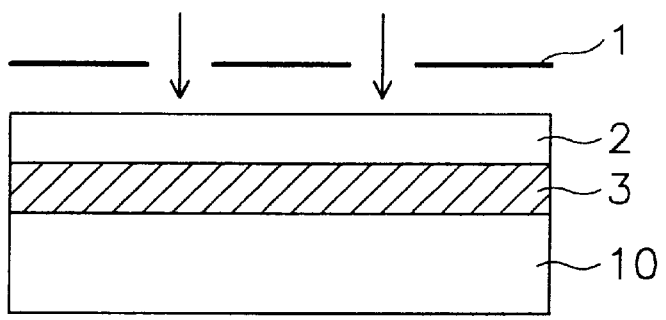
Figure 1C:
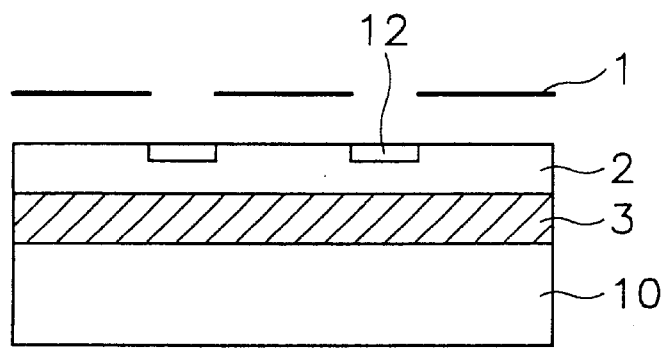
Figure 1D:
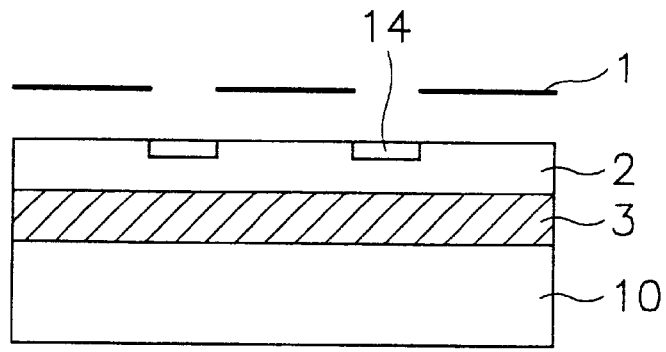
Figure 1E:
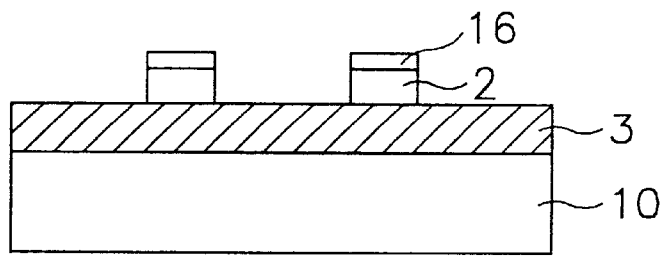
Figure 1F:
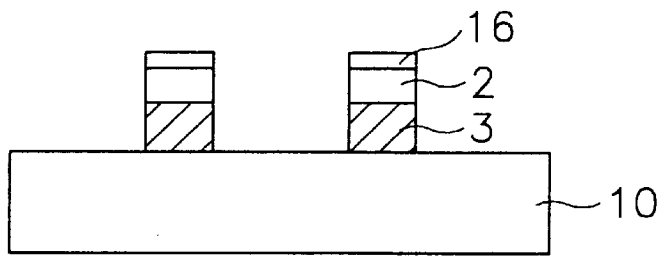

The present invention is related to a polymer represented by Formula 1 below, which polymer is useful as a single layer photoresist or a photoresist used in the TSI process:

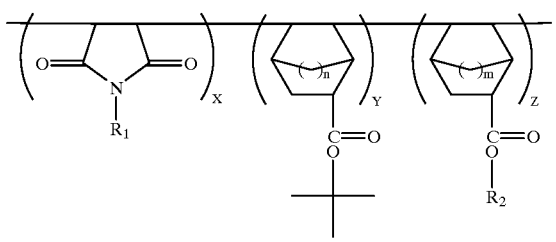

(1)

wherein, $R_1$ is a $C_1$–$C_{10}$ straight- or branched-chain substituted alkyl, or benzyl group; $R_2$ is $C_1$–$C_{10}$ primary, secondary or tertiary alcohol group; m and n independently represent a number from 1 to 3; and X, Y and Z are the respective polymerization ratios of the co-monomers.

The polymer represented by Formula 1 above can be prepared according to the present invention by polymerizing the following three monomers in the presence of a polymerization initiator:

i) an alkyl maleimide (which is represented by Formula 2 below):

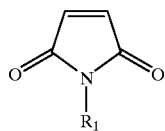

(2)

ii) a compound represented by the following Formula 3:

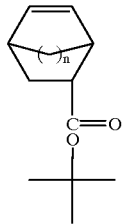

(3)

and iii) and a compound represented by following Formula 4:

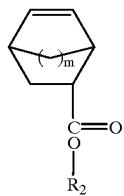

(4)

wherein, $R_1$ is a $C_0$–$C_{10}$ straight- or branched-chain alkyl group, or a benzyl group; $R_2$ is a $C_1$–$C_{10}$ primary, secondary or tertiary alcohol group; and m and n independently represent a number from 1 to 3.

Preferred alkyl maleimide compounds of Formula 2 are methyl maleimide, ethyl maleimide, propyl maleimide, i-propyl maleimide, n-butyl maleimide, i-butyl maleimide, t-butyl maleimide, pentyl maleimide and the like, with ethyl maleimide, propyl maleimide, or t-butyl maleimide being the most preferred.

Preferred compounds of Formula 3 are t-butyl 5-norbornene-2-carboxylate and t-butyl bicyclo[2,2,2]oct-5-ene-2-carboxylate.

Preferred compounds of Formula 4 are compounds in which $R_2$ is methyl alcohol, ethyl alcohol, propyl alcohol, butyl alcohol, or pentyl alcohol. Most preferably, the compound of Formula 4 is 2-hydroxyethyl 5-norbornene-2-carboxylate, 3-hydroxypropyl 5-norbornene-2-carboxylate, 2-hydroxyethyl bicyclo[2,2,2]oct-5-ene-2-carboxylate, or 3-hydroxypropyl bicyclo[2,2,2]oct-5-ene-2-carboxylate.

According to a preferred embodiment of the present invention, the compounds of Formula 2, Formula 3 and Formula 4 are reacted in a mol ratio of (1–2):(0.5–1.5):(0.5–1.5) respectively.

The polymers of the present invention can be prepared by a conventional polymerization process such as bulk polymerization or solution polymerization. Benzoyl peroxide, 2,2-azobisisobutyronitrile (AIBN), acetyl peroxide, lauryl peroxide, or t-butyl peroxide can be used as a polymerization initiator. Tetrahydrofuran (THF), cyclohexane, methyl ethyl ketone, benzene, toluene, dioxane, or dimethyl formamide can be used as a polymerization solvent. The polymerization is typically carried out at a temperature between 60° C. and 75° C. in a nitrogen or an argon atmosphere for 4 to 24 hours. However, polymerization conditions are not limited to the above conditions.

The polymers of Formula 1, prepared according to the above polymerization process, are useful as photoresists for forming a micro pattern in the fabrication of a semiconductor element. According to the present invention, a photoresist composition can be prepared by mixing a polymer of Formula 1, a solvent, and a photoacid generator in a conventional manner. The photoacid generator is preferably a sulfur salt or onium salt which is selected from the group consisting of diphenyliodo hexafluorophosphate, diphenyliodo hexafluoroarsenate, diphenyliodo hexafluoroantimonate, diphenyl p-methoxyphenyl triflate, diphenyl p-toluenyl triflate, diphenyl p-isobutylphenyl triflate, diphenyl p-t-butylphenyl triflate, triphenylsulfonium hexafluorophosphate, triphenylsulfonium hexafluoroarsenate, triphenylsulfonium hexafluoroantimonate, triphenylsulfonium triflate, and dibutylnaphthyl sulfonium triflate. The photoacid generator is used in a quantity equal to about 1 to 20 wt % of the photoresist polymer used in the process. The sensitivity of the photoresist composition is insufficient at quantities of photacid generator below 1 wt % and etching resistance is insufficient at quantities over 20 wt %. The solvent used in the composition may be conventional solvents such as methyl-3-methoxypropionate, ethyl lactate, ethyl-3-ethoxypropionate, propylene glycol methyl ether acetate. The solvent is used in a quantity equal to about 100 to 700 wt % of the polymer used in the process. The photoresist composition is preferably formed into a layer with a thickness of 0.3–3 μm.

The present invention also contemplates a method of forming a micro pattern using the above-described photoresist composition in a TSI process. Generally in this process, as illustrated in FIGS. 1a to 1f, a layer of the photoresist composition (2), which is coated on the upper part of etching layer (3) on the surface of a wafer (10), is first hardened (soft baked) by methods know in the art. A mask (1) is used to form exposed regions (12) on the hardened photoresist layer (2), and the photoresist is hardened again (post baked). Then, a silylation agent is sprayed on the element to form a silylation film (14) on the exposed areas. The silylation film (14) is subsequently developed by a dry developing process using $O_2$ plasma to form silicon oxide film (16). Etching layer (3) is then etched using the silicon oxide film (16) as an etching mask to form a pattern on etching layer (3).

A better understanding of the present invention may be obtained by reference to the following examples which are set forth to illustrate, but not limit, the present invention.

PREPARATION EXAMPLE 1

Synthesis of poly(ethyl maleimide/t-butyl 5-norbornene-2-carboxylate/2-hydroxyethyl 5-norbornene-2-carboxylate) polymer (Formula 5)

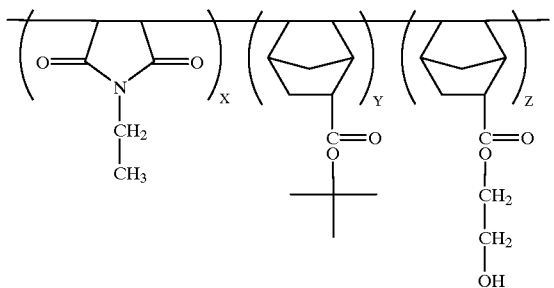

(5)

Figure 2:
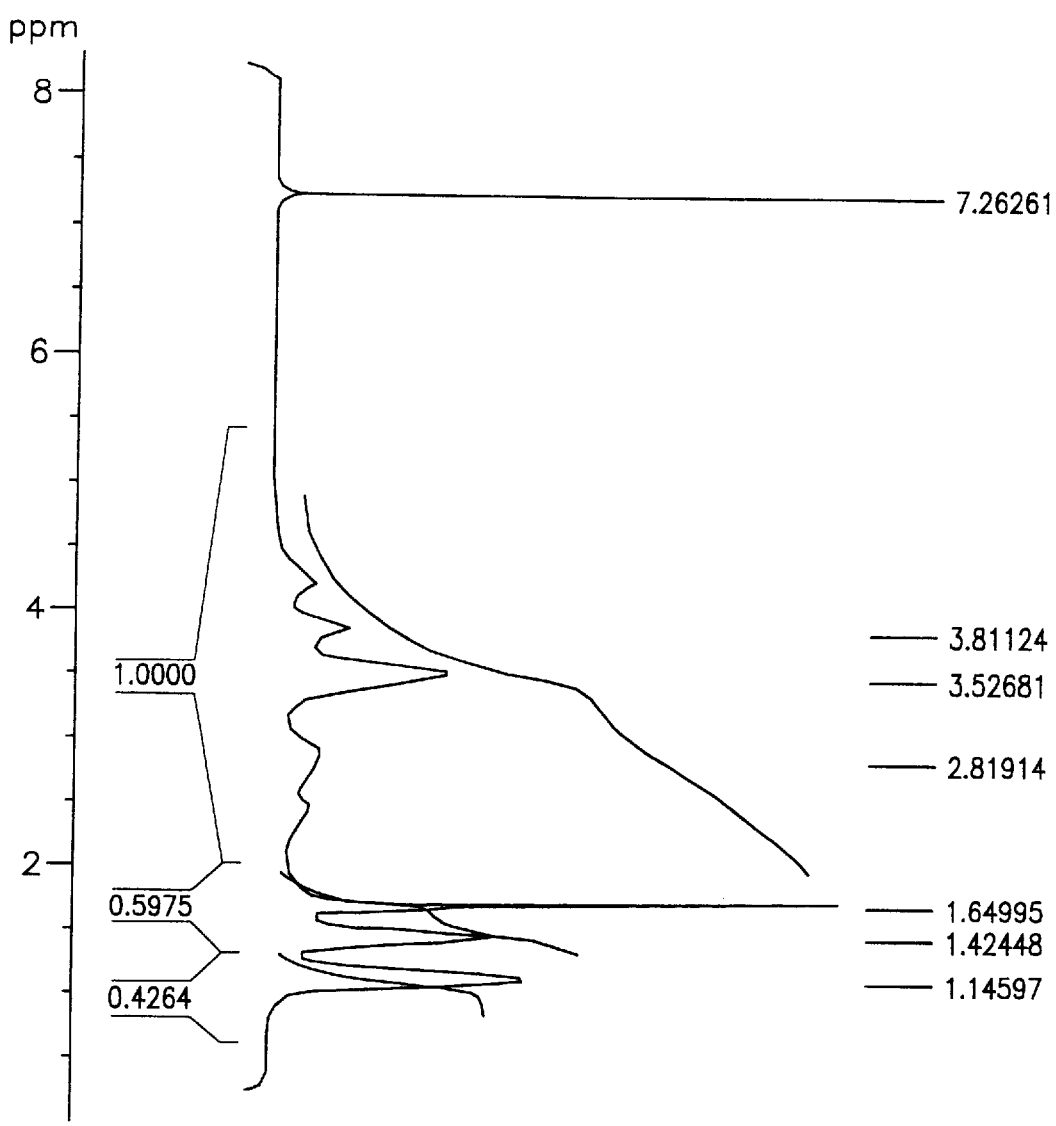
FIGS. 2 to 4 are NMR spectra of polymers of the present invention (represented by Formulas 5, 6, and 8) prepared in the Preparation Examples herein.

Ethyl maleimide (1 mol.), t-butyl 5-norbornene-2-carboxylate (0.5 mol.) and 2-hydroxyethyl 5-norbornene-2-carboxylate (0.5 mol) were dissolved in 50 g to 300 g of tetrahydrofuran (THF), 2 g to 15 g of 2,2'-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(ethyl maleimide/t-butyl 5-norbornene-2-carboxylate/2-hydroxyethyl 5-norbornene-2-carboxylate) polymer was obtained at a yield of about 85%. NMR spectra of the polymer is illustrated in FIG. 2.

PREPARATION EXAMPLE 2

Synthesis of poly(propyl maleimide/t-butyl 5-norbornene-2-carboxylate/3-hydroxypropyl 5-norbornene-2-carboxylate) polymer (Formula 6)

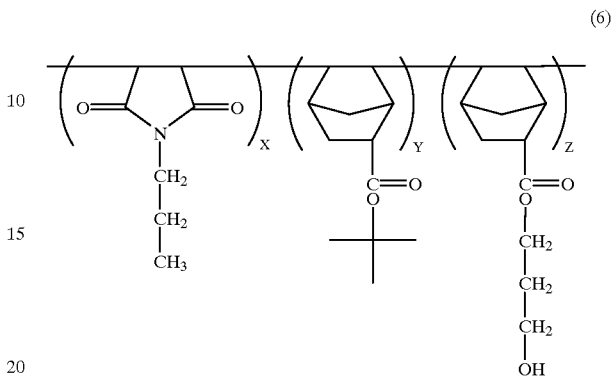

(6)

Figure 3:
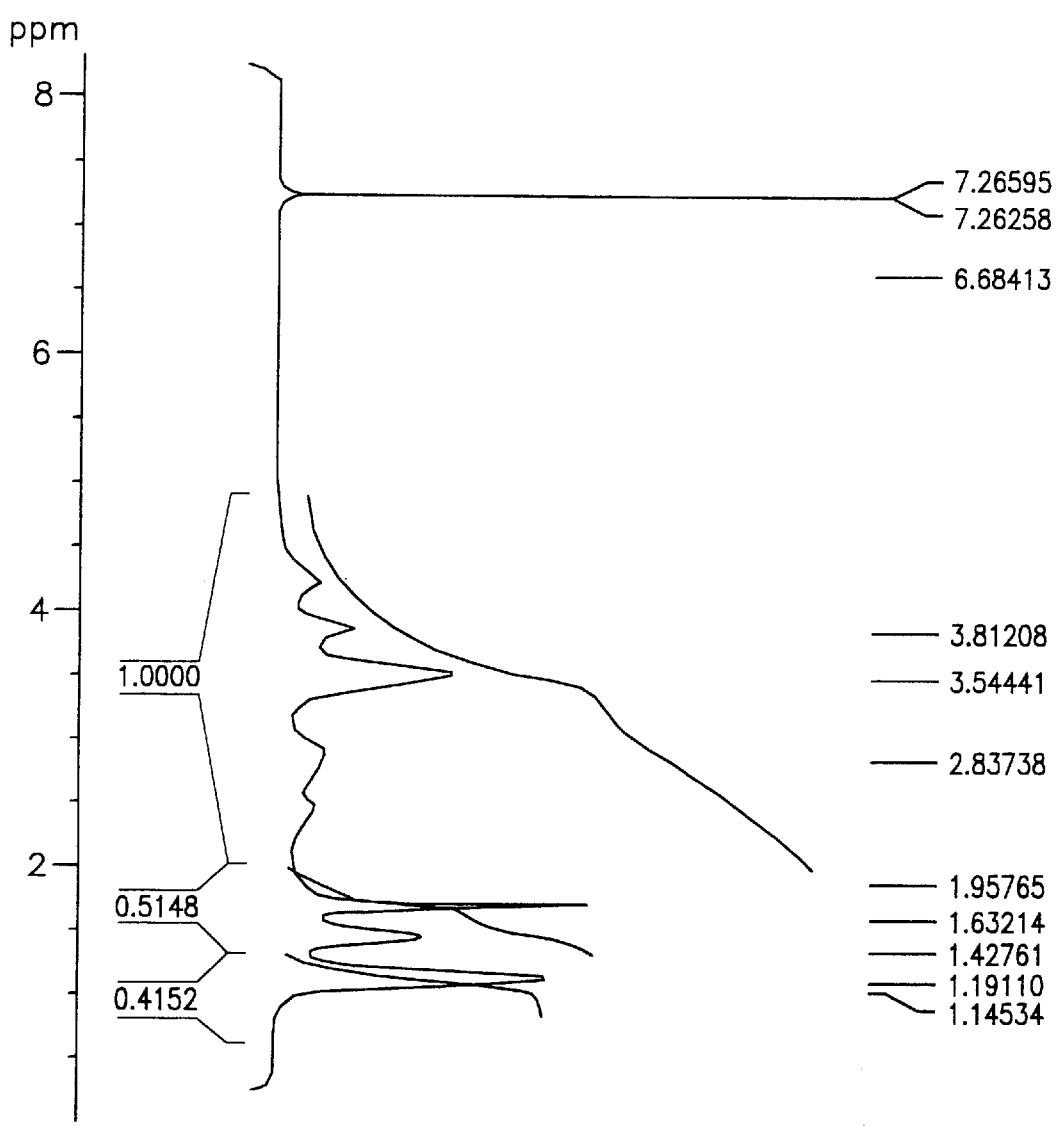

Propyl maleimide (1 mol.), t-butyl 5-norbornene-2-carboxylate (0.5 mol.), and 3-hydroxypropyl 5-norbornene-2-carboxylate (0.5 mol.) were dissolved in 50 g to 300 g of tetrahydrofuran (THF), 2 g to 15 g of 2,2'-azobisisobutyronitrile (AIBN) were added thereto, then the resultant solution was reacted at a temperature of 60° C. to 70° C. in a nitrogen atmosphere for 10 hours. After a high molecular weight was achieved by the reaction, the resultant product was precipitated in an ethyl ether or hexane solvent. The gathered precipitate was dried, and the desired poly (propyl maleimide/t-butyl 5-norbornene-2-carboxylate/3-hydroxypropyl 5-norbornene-2-carboxylate) polymer was obtained at a yield of about 82%. NMR spectra of the polymer is illustrated in FIG. 3.

PREPARATION EXAMPLE 3

Synthesis of poly(t-butyl maleimide/t-butyl bicyclo [2,2,2]oct-5-ene-2-carboxylate/2-hydroxyethyl 5-norbornene-2-carboxylate) polymer (Formula 7)

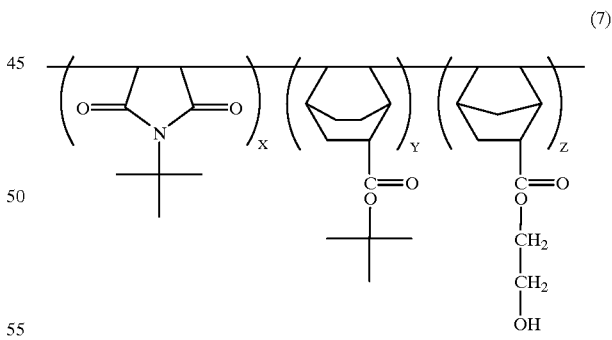

(7)

t-butyl maleimide (1 mol.), t-butyl bicyclo[2,2,2]oct-5-ene-2-carboxylate (0.5 mol.), and 2-hydroxyethyl 5-norbornene-2-carboxylate (0.5 mol.) were dissolved in 50 g to 300 g of tetrahydrofuran (THF), 2 g to 15 g of 2,2'-azobisisobutyronitrile (AIBN) were added thereto, then the resultant solution was reacted at a temperature of 60° C. to 70° C. in a nitrogen atmosphere for 10 hours. After a high molecular weight was achieved by the reaction, the resultant product was precipitated in an ethyl ether or hexane solvent. The gathered precipitate was dried, and the desired poly(t-butyl maleimide/t-butyl bicyclo[2,2,2]oct-5-ene-2-carboxylate/2-hydroxyethyl 5-norbornene-2-carboxylate) polymer was obtained at a yield of about 75%.

PREPARATION EXAMPLE 4

Synthesis of poly(ethyl maleimide/t-butyl bicyclo[2,2,2]oct-5-ene-2-carboxylate/3-hydroxypropyl 5-norbornene-2-carboxylate) polymer (Formula 8)

(8)

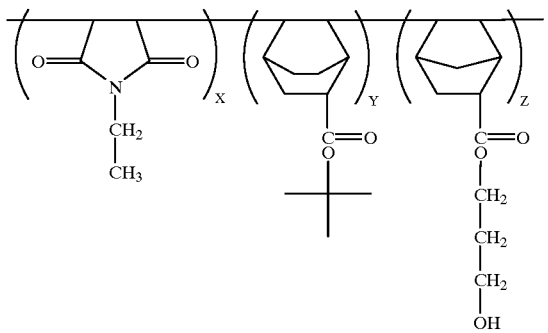

Figure 4:
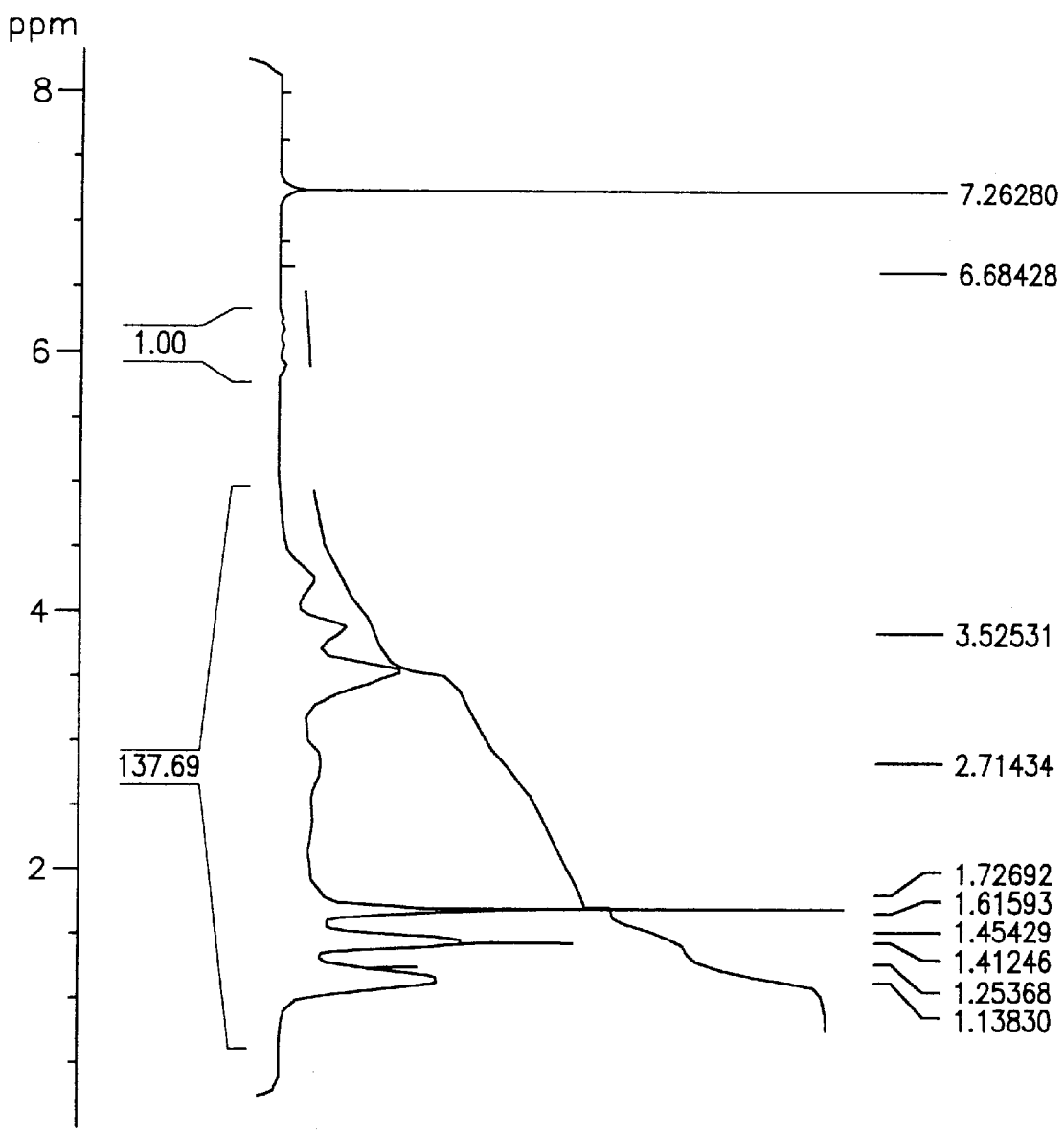
Figure 5:
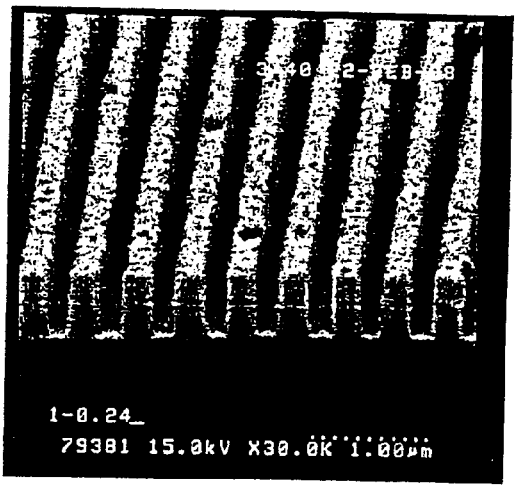
FIGS. 5 to 12 are cross-sectional views showing the appearance of a pattern formed by an exposing energy level of 48 mJ/cm$^2$.
Figure 6:
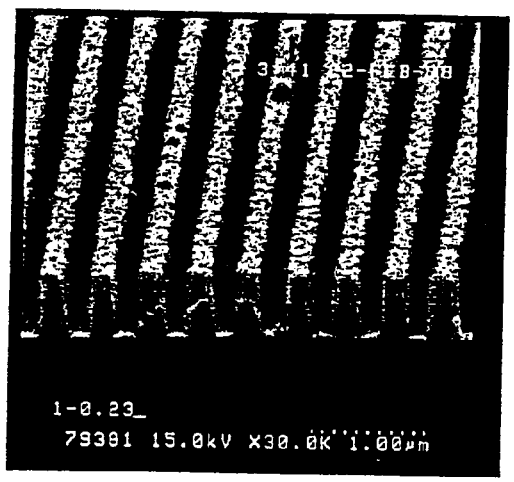
Figure 7:
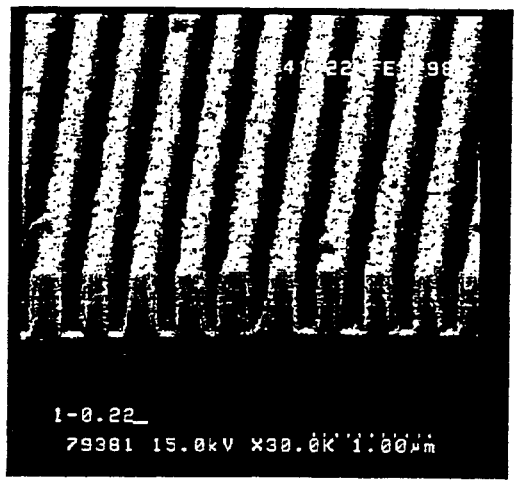
Figure 8:
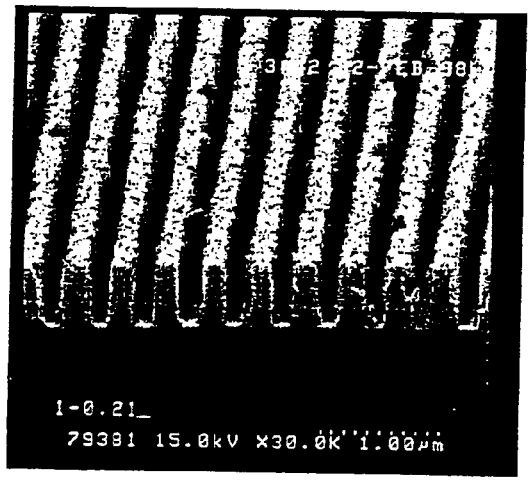
Figure 9:
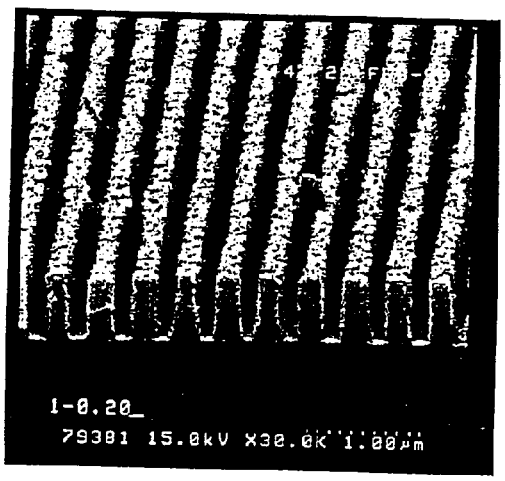
Figure 10:
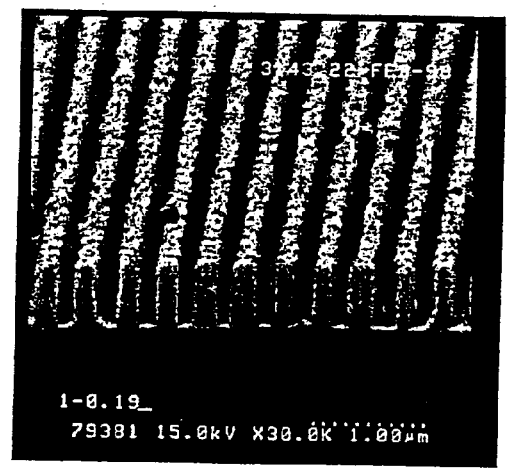
Figure 11:
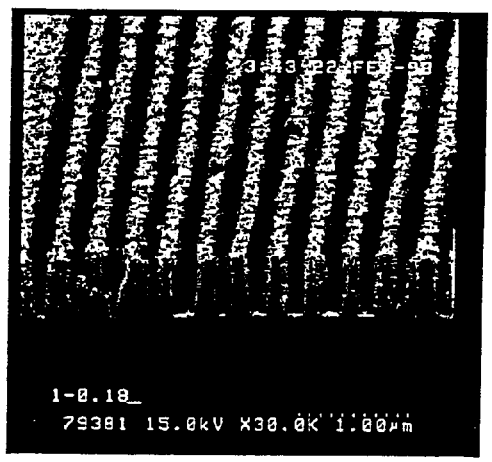
Figure 12:
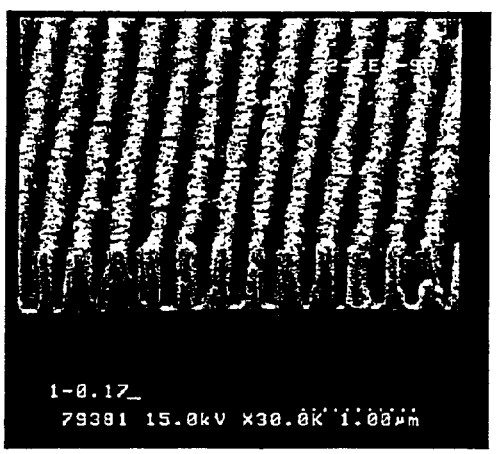
Figure 13:
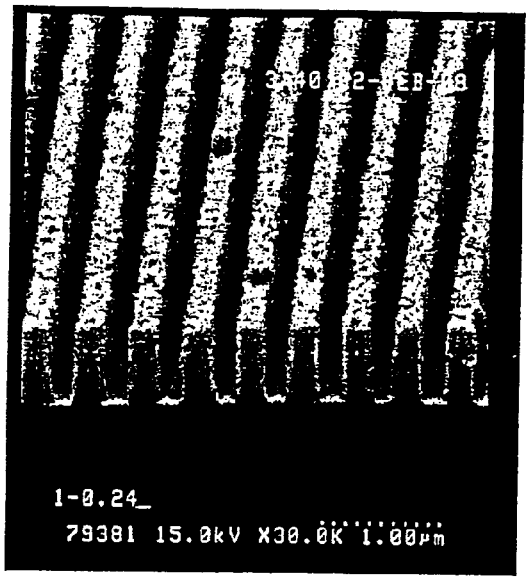
FIGS. 13 to 20 are cross-sectional views showing the appearance of a pattern formed by various exposing energies indicated therein.
Figure 14:
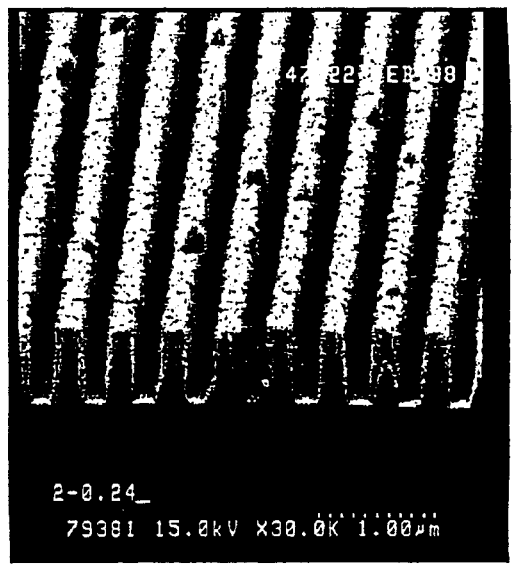
Figure 15:
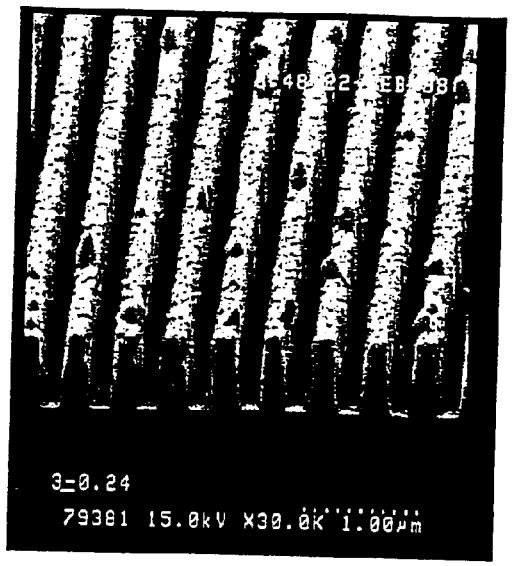
Figure 16:
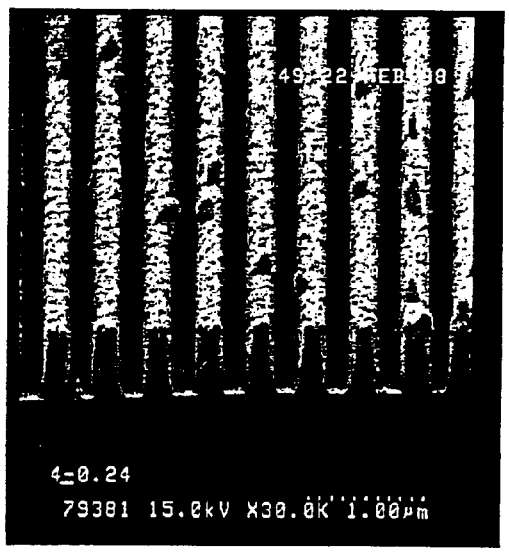
Figure 17:
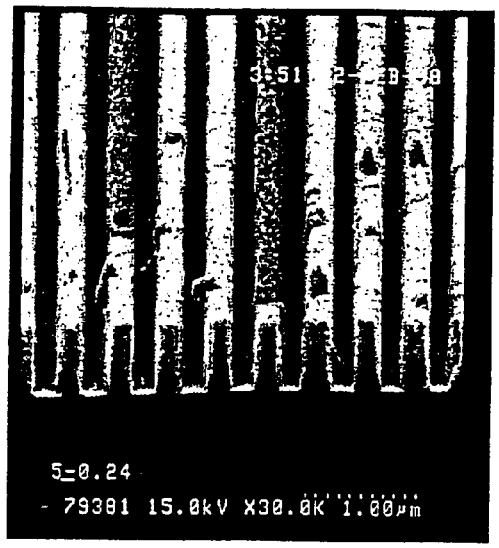
Figure 18:
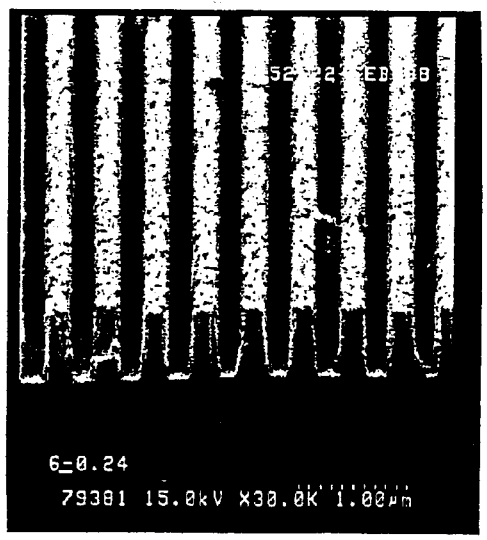
Figure 19:
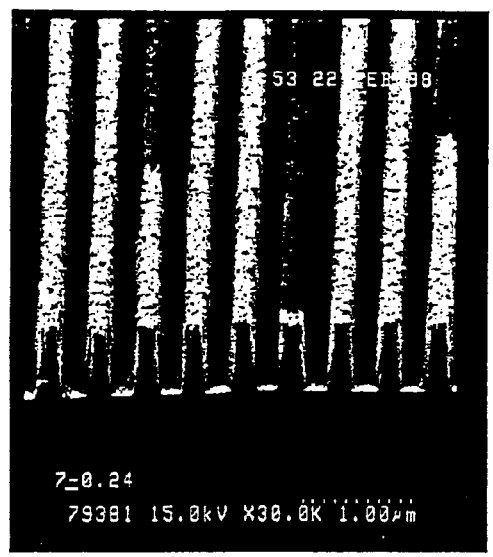
Figure 20:
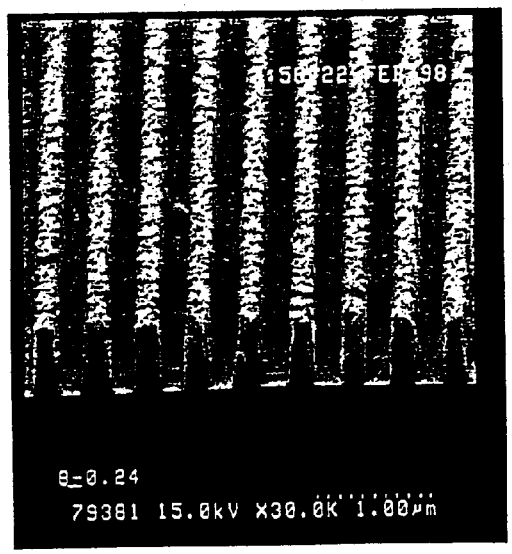

Ethyl maleimide (1 mol.), t-butyl bicyclo[2,2,2]oct-5-ene-2-carboxylate (0.5 mol.) and 3-hydroxypropyl 5-norbornene-2-carboxylate (0.5 mol) were dissolved in 50 g to 300 g of tetrahydrofuran (THF), 2 g to 15 g of 2,2′-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(ethyl maleimide/t-butyl bicyclo[2,2,2]oct-5-ene-2-carboxylate/3-hydroxypropyl 5-norbornene-2-carboxylate) polymer was obtained at a yield of about 83%. NMR spectra of the polymer is illustrated in FIG. 4.

PREPARATION EXAMPLE 5

Synthesis of poly(propyl maleimide/t-butyl 5-norbornene-2-carboxylate/2-hydroxyethyl bicyclo[2,2,2]oct-5-ene-2-carboxylate) polymer (Formula 9)

(9)

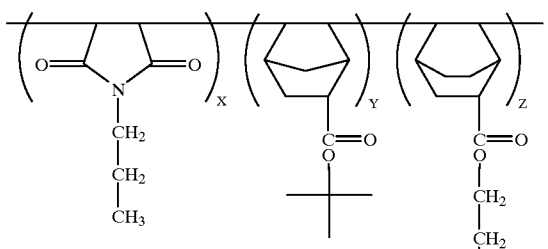

Propyl maleimide (1 mol.), t-butyl 5-norbornene-2-carboxylate (0.5 mol.) and 2-hydroxyethyl bicyclo[2,2,2]oct-5-ene-2-carboxylate (0.5 mol) were dissolved in 50 g to 300 g of tetrahydrofuran (THF), 2 g to 15 g of 2,2′-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(propyl maleimide/t-butyl 5-norbornene-2-carboxylate/2-hydroxyethyl bicyclo[2,2,2]oct-5-ene-2-carboxylate) polymer was obtained at a yield of about 79%.

PREPARATION EXAMPLE 6

Synthesis of poly(ethyl maleimide/t-butyl 5-norbornene-2-carboxylate/3-hydroxypropyl bicyclo[2,2,2]oct-5-ene-2-carboxylate) polymer (Formula 10)

(10)

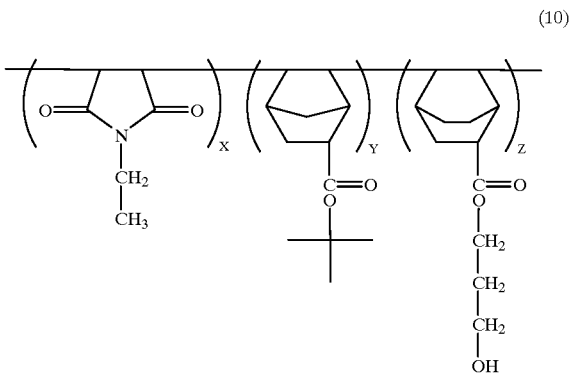

Ethyl maleimide (1 mol.), t-butyl 5-norbornene-2-carboxylate (0.5 mol.) and 2-hydroxyethyl bicyclo[2,2,2]oct-5-ene-2-carboxylate (0.5 mol) were dissolved in 50 g to 300 g of tetrahydrofuran (THF), 2 g to 15 g of 2,2′-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(ethyl maleimide/t-butyl 5-norbornene-2-carboxylate/3-hydroxypropyl bicyclo[2,2,2]oct-5-ene-2-carboxylate) polymer was obtained at a yield of about 78%.

PREPARATION EXAMPLE 7

Synthesis of poly(propyl maleimide/t-butyl bicyclo[2,2,2]oct-5-ene-2-carboxylate/2-hydroxyethyl bicyclo[2,2,2]oct-5-ene-2-carboxylate) polymer (Formula 11)

(11)

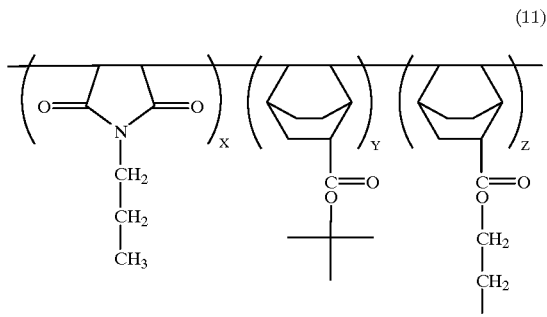

Propyl maleimide (1 mol.), t-butyl bicyclo[2,2,2]oct-5-ene-2-carboxylate (0.5 mol.) and 3-hydroxypropyl bicyclo[2,2, 2]oct-5-ene-2-carboxylate (0.5 mol) were dissolved in 50 g to 300 g of tetrahydrofuran (THF), 2 g to 15 g of 2,2'-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(propyl maleimide/t-butyl bicyclo[2,2,2]oct-5-ene-2-carboxylate/2-hydroxyethyl bicyclo[2,2,2]oct-5-ene-2-carboxylate) polymer was obtained at a yield of about 78%.

PREPARATION EXAMPLE 8

Synthesis of poly(ethyl maleimide/t-butyl bicyclo[2,2,2]oct-5-ene-2-carboxylate/3-hydroxypropyl bicyclo[2,2,2]oct-5-ene-2-carboxylate) polymer (Formula 12)

(12)

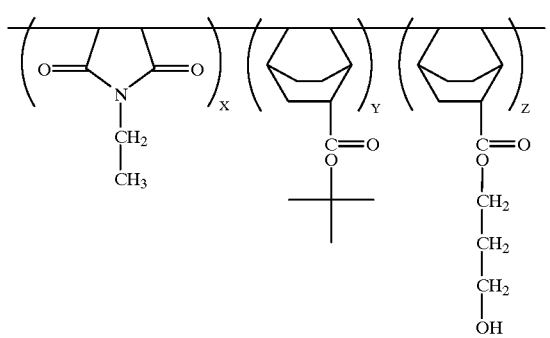

Ethyl maleimide (1 mol.), t-butyl bicyclo[2,2,2]oct-5-ene-2-carboxylate (0.5 mol.) and 3-hydroxypropyl bicyclo[2,2,2]oct-5-ene-2-carboxylate (0.5 mol) were dissolved in 50 g to 300 g of tetrahydrofuran (THF), 2 g to 15 g of 2,2'-azobisisobutyronitrile (AIBN) was added thereto, and the resulting solution was reacted at a temperature between 60° C. and 70° C. in a nitrogen atmosphere for 10 hours. After a high molecular weight was achieved by the reaction, the resultant product was precipitated in an ethyl ether or hexane solvent. The gathered precipitate was dried, and the desired poly(ethyl maleimide/t-butyl bicyclo[2,2,2]oct-5-ene-2-carboxylate/bicyclo[2,2,2]oct-5-ene-2-carboxylate) polymer was obtained at a yield of 75%

EXAMPLE 1

Preparation of Photoresist Composition and Forming of Pattern 10 g of poly(ethyl maleimide/t-butyl 5-norbornene-2-carboxylate/2-hydroxyethyl 5-norbornene-2-carboxylate) polymer, prepared according to Preparation Example 1, were dissolved in 10 g of methyl 3-methoxypropionate as a solvent, and 0.1 g to 2 g of triphenylsulfonium triflate or dibutylnaphthylsulfonium triflate were added thereto. Then the resultant solution was filtered through filter of 0.10 μm to prepare a photoresist composition which was coated on a surface of a wafer. A desirable photoresist pattern was then formed according to the method illustrated in FIG. 1.

EXAMPLE 2

Preparation of Photoresist Composition and Forming of Pattern

According to the method of Example 1 above, a photoresist pattern was formed using 10 g of the poly(propyl maleimide/t-butyl 5-norbornene-2-carboxylate/3-hydroxypropyl 5-norbornene-2-carboxylate) polymer prepared according to Preparation Example 2.

EXAMPLE 3

Preparation of Photoresist Composition and Forming of Pattern

According to the method of Example 1 above, a photoresist pattern was formed using 10 gms of the poly(t-butyl maleimide/t-butyl bicyclo[2,2,2]oct-5-ene-2-carboxylate/2-hydroxy ethyl 5-norbornene-2-carboxylate) polymer prepared according to Preparation Example 3.

EXAMPLE 4

Preparation of Photoresist Composition and Forming of Pattern

According to the method of Example 1 above, a photoresist pattern was formed using 10 gms of the poly(ethyl maleimide/t-butyl bicyclo[2,2,2]oct-5-ene-2-carboxylate/3-hydroxypropyl 5-norbornene-2-carboxylate) prepared according to Preparation Example 4.

EXAMPLE 5

Preparation of Photoresist Composition and Forming of Pattern

According to the method of Example 1 above, a photoresist pattern was formed using 10 gms of the poly(propyl maleimide/t-butyl 5-norbornene-2-carboxylate/2-hydroxyethyl bicyclo[2,2,2]oct-5-ene-2-carboxylate) polymer prepared according to Preparation Example 5 (10 g).

EXAMPLE 6

Preparation of Photoresist Composition and Forming of Pattern

According to the method of Example 1, a photoresist pattern was formed using 10 gms of the poly(ethyl maleimide/t-butyl 5-norbornene-2-carboxylate/3-hydroxypropyl bicyclo[2,2,2]oct-5-ene-2-carboxylate) polymer prepared according to Preparation Example 6.

EXAMPLE 7

Preparation of Photoresist Composition and Forming of Pattern

According to the method of Example 1, a photoresist pattern was formed using 10 gms of the poly(propyl maleimide/t-butyl bicyclo[2,2,2]oct-5-ene-2-carboxylate/2-hydroxyethyl bicyclo[2,2,2]oct-5-ene-2-carboxylate) polymer prepared according to Preparation Example 7.

EXAMPLE 8

Preparation of Photoresist Composition and Forming of Pattern

According to the method of Example 1, a photoresist pattern was formed using 10 gms of the poly(ethyl maleimide/t-butyl bicyclo[2,2,2]oct-5-ene-2-carboxylate/3-hydroxy propyl bicyclo[2,2,2]oct-5-ene-2-carboxylate) polymer prepared according to Preparation Example 8.

The photoresist of Example 1 was used to form the patterns shown in FIG. 5 to FIG. 12 by exposure to energy of 48 mJ/cm² and the patterns shown in FIG. 13 to FIG. 20 by exposure to energy of various levels indicated therein.

As described above, an ArF photoresist is provided in accordance with the present invention which has heat resistance sufficient to endure the post-baking and silylation processes which are carried out at a high temperature in the TSI process. Also, the pattern using a chemically amplified photoresist of the present invention is resolved through the usage of a small energy level of 10 mJ/cm² thereby preventing the damage that occurs to the lens of an exposer when an ArF light source is used. When O₂ plasma is used in the silylation process with a polymer of the present invention, a silicon oxide film is formed thereby increasing etching resistance and heat resistance of the photoresist. Thus, a micro pattern can be formed through the dry developing process and high integration of a semiconductor element is possible through the use of a photoresist employing a polymer of the present invention.

Other features, such as other advantages and embodiments, of the invention disclosed herein will be readily apparent to those of ordinary skill in the art after reading the foregoing disclosures. In this regard, while specific embodiments of the invention have been described in considerable detail, variations and modifications of these embodiments can be effected without departing from the spirit and scope of the invention as described and claimed.

What is claimed is:

1. A photoresist polymer represented by following Formula 1:

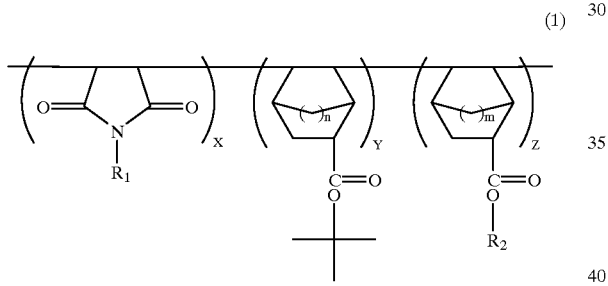

(1)

wherein, R₁ is a C₁–C₁₀ straight- or branched-chain substituted alkyl group, or a benzyl group; R₂ is C₁–C₁₀ primary, secondary or tertiary alcohol group; m and n independently represent an number from 1 to 3; and X, Y and Z are the respective polymerization ratios of the co-monomers.

2. A photoresist polymer in accordance with claim 1, wherein the ratio X:Y:Z is (10–80 mol %):(10–80 mol %):(10–80 mol %).

3. A photoresist polymer in accordance with claim 1, wherein the photoresist polymer is selected from the group consisting of:

poly(ethyl maleimide/t-butyl 5-norbonene-2-carboxylate/2-hydroxy ethyl 5-norbonene-2-carboxylate);

poly(propyl maleimide/t-butyl 5-norbonene-2-carboxylate/3-hydroxy propyl 5-norbonene-2-carboxylate);

poly(t-butyl maleimide/t-butyl bicyclo[2,2,2]oct-5-en-2-carboxylate/2-hydroxy ethyl 5-norbonene-2-carboxylate);

poly(ethyl maleimide/t-butyl bicyclo[2,2,2]oct-5-en-2-carboxylate/3-hydroxy propyl 5-norbonene-2-carboxylate);

poly(propyl maleimide/t-butyl 5-norbonene-2-carboxylate/2-hydroxy ethyl bicyclo[2,2,2]oct-5-en-2-carboxylate);

poly(ethyl maleimide/t-butyl 5-norbonene-2-carboxylate/3-hydroxy propyl bicyclo[2,2,2]oct-5-en-2-carboxylate);

poly(propyl maleimide/t-butyl bicyclo[2,2,2]oct-5-en-2-carboxylate/2-hydroxy ethyl bicyclo[2,2,2]-5-en-2-carboxylate); and poly(ethyl maleimide/t-butyl bicyclo[2,2,2]oct-5-en-2-carboxylate/3-hydroxy propyl bicyclo[2,2,2]oct-5-en-2-carboxylate).

4. A method for preparing a photoresist polymer, comprising the steps of:

a) dissolving a compound of Formula 2:

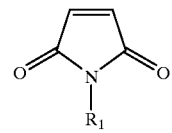

a compound of Formula 3:

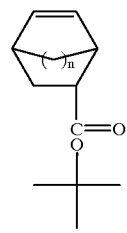

and, a compound of Formula 4:

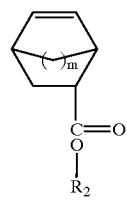

in an organic polymerization solvent;

wherein R₁ is a C₁–C₁₀ straight- or branched-chain substituted alkyl group, or a benzyl group; R₂ is a C₁–C₁₀ primary, secondary or tertiary alcohol group: and m and n independently represent a number from 1 to 3;

b) polymerizing the compounds by adding a polymerization initiator to the resultant solution and thereby forming a precipitate, and;

c) recovering and drying the precipitate.

5. A method of preparing a photoresist polymer in accordance with claim 4, wherein the polymerization initiator is benzoyl peroxide, 2,2-azobisisobutyronitrile, acetyl peroxide, lauryl peroxide, or t-butyl acetate.

6. A method of preparing a photoresist polymer in accordance with claim 4, wherein the polymerization organic solvent is tetrahydrofuran, cyclohexane, methyl ethyl ketone, benzene, toluene, dioxane, dimethyl formamide or a mixture thereof.

7. A method of preparing a photoresist polymer in accordance with claim 4 wherein the solution obtained in the (b) step is maintained at a temperature between 60° C. and 70° C. in a nitrogen or an argon atmosphere for 4 to 24 hours.

8. A photoresist composition comprising:
(i) a photoresist polymer of Formula 1:

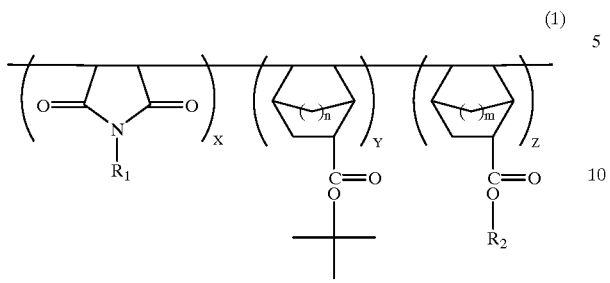

wherein, $R_1$ is a $C_1-C_{10}$ straight- or branched-chain substituted alkyl group, or a benzyl group; $R_2$ is $C_1-C_{10}$ primary, secondary or tertiary alcohol group; m and n independently represent a number from 1 to 3; and X, Y and Z are the respective polymerization ratios of the co-monomers;
(ii) a photoacid generator; and,
(iii) an organic solvent.

9. A photoresist composition in accordance with claim 8, wherein the photoacid generator is a sulfur salt or an onium salt.

10. A photoresist composition in accordance with claim 8, wherein the photoacid generator is selected from the group consisting of diphenyliodohexafluoro phosphate, diphenyliodohexafluoro arsenate, diphenyliodohexafluoro antimonate, diphenyl p-methoxyphenyl triflate, diphenyl p-toluenyl triflate, diphenyl p-isobutylphenyl triflate, diphenyl p-t-butylphenyl triflate, triphenylsulfonium hexafluorophosphate, triphenylsulfonium hexafluoroarsenate, triphenylsulfonium hexafluoroantimonate, triphenylsulfonium triflate, and dibutylnaphthylsulfonium triflate.

11. A photoresist composition in accordance with claim 8, wherein the organic solvent is ethyl-3-ethoxy propionate, ethyl lactate, methyl-3-methoxy propionate, propylene glycol methyl ether acetate or a mixture thereof.

12. A photoresist composition in accordance with claim 8, wherein the photoacid generator is present in a quantity equal to 1 to 20 wt % on the basis of the photoresist polymer used.

13. A photoresist compostition in accordance with claim 8, wherein the organic solvent is present in an amount equal to 100 to 700 wt % on the basis of the photoresist polymer used.

14. A semiconductor element using the photoresist composition defined by claim 8.

15. A method of forming a photoresist pattern, comprising the steps of:

a) preparing a photoresist composition comprising:
(i) a photoresist polymer of Formula 1:

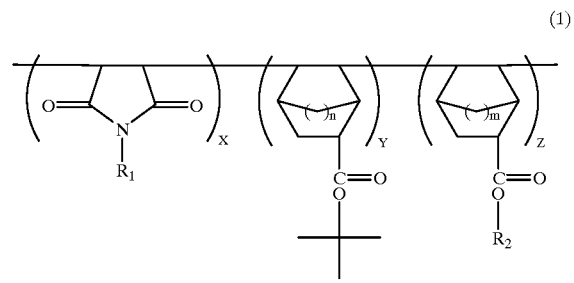

wherein $R_1$ is a $C_1-C_{10}$ straight- or branched-chain substituted alkyl group, or a benzyl group; $R_2$ is $C_1-C_{10}$ primary, secondary or tertiary alcohol group; m and n independently represent a number from 1 to 3; and X, Y and Z are the respective polymerization ratios of the co-monomers.
   a photoacid generator; and,
   (iii) an organic solvent.
b) coating the photoresist composition on a substrate having an etching layer coated on the surface thereof;
c) exposing the photoresist layer to a light source using an exposer;
d) spraying a silylation agent on the exposed photoresist layer;
e) dry etching the silylated photoresist layer.

16. A method of forming a photoresist pattern in accordance with claim 15, which further comprises a baking step before and/or after the (c) step, wherein the baking is carried out at 90° C. to 180° C. for 30 to 300 seconds.

17. A method of forming a photoresist pattern in accordance with claim 16, wherein the (c) step is carried out using irradiating energy of 1–50 mJ/cm$^2$.

18. A method of forming a photoresist pattern in accordance with claim 15, wherein the (c) step is carried out by using an ArF, EUV, e-beam, ion-beam, or X-ray light source.

19. A method of forming a photoresist pattern in accordance with claim 15, wherein the silylation agent is selected from the group consisting of hexamethyldisilazane, tetramethyldisilazane, dimethylaminomethylsilane, dimethylaminomethylsilane, dimethylsilyldimethylamine, trimethylsilyldimethylamine, trimethylsilyldiethylamine and dimethylaminopentamethylsilane.

20. A method of forming a photoresist pattern in accordance with claim 15, wherein the (d) step is carried out at 90° C. to 180° C. for 30 to 300 seconds.

* * * * *

UNITED STATES PATENT AND TRADEMARK OFFICE
CERTIFICATE OF CORRECTION

PATENT NO. : 6,225,020 B1  
DATED : May 1, 2001  
INVENTOR(S) : Jae Chang Jung; Myoung Soo Kim; Hyung Gi Kim; Chi Hyeong Roh; Geun Su Lee; Min Ho Jung; Cheol Kyu Bok; Ki Ho Baik It is certified that error appears in the above-identified patent and that said Letters Patent is hereby corrected as shown below:

<u>Column 14, claim 15,</u>  
Line 21, the ".", should read -- ; --.  
Line 22, insert -- (ii) -- at the beginning of the line.

Signed and Sealed this

Eleventh Day of December, 2001

Attest:

*Nicholas P. Godici*

NICHOLAS P. GODICI  
*Attesting Officer*  *Acting Director of the United States Patent and Trademark Office*